United States Patent
Liao et al.

(10) Patent No.: US 8,599,563 B2
(45) Date of Patent: Dec. 3, 2013

(54) CONTROL PANEL HAVING A PIVOTABLE CONNECTOR

(75) Inventors: Chun-Chao Liao, Taipei (TW); Wen-Ju Hsieh, Taipei (TW)

(73) Assignee: Cyber Power Systems, Inc., Taipei (TW)

( * ) Notice: Subject to any disclaimer, the term of this patent is extended or adjusted under 35 U.S.C. 154(b) by 350 days.

(21) Appl. No.: 13/073,003

(22) Filed: Mar. 28, 2011

(65) Prior Publication Data
US 2012/0250263 A1  Oct. 4, 2012

(51) Int. Cl.
*H05K 7/00* (2006.01)

(52) U.S. Cl.
USPC ............................ 361/728; 361/752; 361/755

(58) Field of Classification Search
USPC ................. 361/728–730, 752, 796, 800, 755
See application file for complete search history.

(56) References Cited

U.S. PATENT DOCUMENTS

| | | | | |
|---|---|---|---|---|
| 5,166,476 A * | 11/1992 | Stumm | ........................ | 174/663 |
| 5,940,937 A * | 8/1999 | Churchill et al. | ............... | 16/382 |
| 6,373,689 B1 * | 4/2002 | Yim | ......................... | 361/679.29 |
| 7,641,399 B2 * | 1/2010 | Loch et al. | ...................... | 385/92 |
| 7,929,291 B2 * | 4/2011 | Park et al. | ................ | 361/679.41 |
| 8,203,844 B2 * | 6/2012 | Sip et al. | ....................... | 361/755 |
| 8,251,719 B1 * | 8/2012 | Pan et al. | ..................... | 439/142 |

* cited by examiner

*Primary Examiner* — Hung S Bui
(74) *Attorney, Agent, or Firm* — Rosenberg, Klein & Lee (57) ABSTRACT

A control panel having a pivotable connector has a body, a rear cover and a connector. The connector is pivotally mounted inside the body and the rear cover, and has a plug being pivotable and freely aligned with an intended direction. Accordingly, users can adjust the orientation of the connector based on a position on which the control panel is to be mounted, placed or hung, so that the connector of the control panel can be smoothly connected with a connection port of the machine directly or through a connection cable.

1 Claim, 13 Drawing Sheets

CONTROL PANEL HAVING A PIVOTABLE CONNECTOR

BACKGROUND OF THE INVENTION

1. Field of the Invention

The present invention relates to a control panel, and more particularly to a control panel having a pivotable connector to be detachably mounted to a machine.

2. Description of the Related Art

Control panels are interfaces usually mounted on machines for users to set up parameters of machines and control the machines. Conventional control panels are integrally built with machines. As a consequence, it is inconvenient for users to remotely control the machines by the control panels. Therefore, external control panels are brought into play in response to the inconvenience. A connector of such an external control panel is connected with a connection cable of a machine so that the control panel can still be operated in a detachable manner. However, the connectors of the control panels are mounted to either face down or rearwards. When users intend to place the control panel on a wall, it is inconvenient for the connector facing rearwards to be connected with the connection cable of the machine. When users intend to let the control panel stand on a table, it is also inconvenient for the connector facing down to be connected with the connection cable of the machine. Accordingly, a control panel having a connector with flexible and convenient orientations for connection needs to be provided.

SUMMARY OF THE INVENTION

An objective of the present invention is to provide a control panel having a pivotable connector to be detachably mounted to a machine.

To achieve the foregoing objective, the control panel having a pivotable connector has a body, a rear cover and a connector.

The body has a rear, a recess and two first holders. The recess is formed in a lower portion of the rear and has two opposite inner walls. The first holders are parallelly and respectively formed on and protrude rearwards from the two opposite inner walls of the recess.

The rear cover is mounted on the rear of the body, and has an opening, two second holders, a wallmount hole and a connection hole. The opening is formed through a bottom portion of the rear cover, corresponds to and communicates with the recess of the body, and has two opposite inner walls. The second holders are parallelly and respectively formed on and protrude forwards from the two opposite inner walls of the opening and respectively align with the first holders. The wallmount hole and the connection hole are formed through the rear cover.

The connector is pivotally mounted in the recess of the body and the opening of the rear cover, and has a plug and two pivot joints. The plug is mounted on the connector. The pivot joints are respectively formed on two opposite sides of the connector, and each pivot joint is held within a corresponding first holder and a corresponding second holder.

As a result of the pivotable property of the connector of the control panel, the plug of the control panel can face any direction as the users desire. Therefore, the control panel can be smoothly connected with a machine through a connection port of the machine or an external connection cable.

Other objectives, advantages and novel features of the invention will become more apparent from the following detailed description when taken in conjunction with the accompanying drawings.

DETAILED DESCRIPTION OF THE INVENTION

Figure 1:
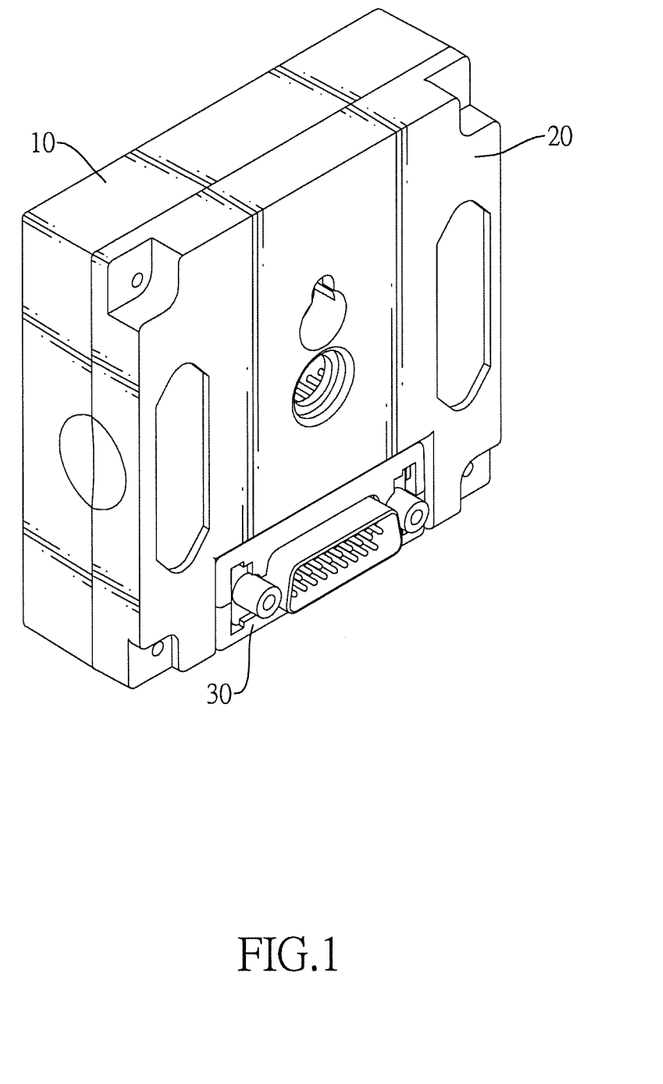
FIG. 1 is a perspective view of a control panel having a pivotable connector in accordance with the present invention.
Figure 2:
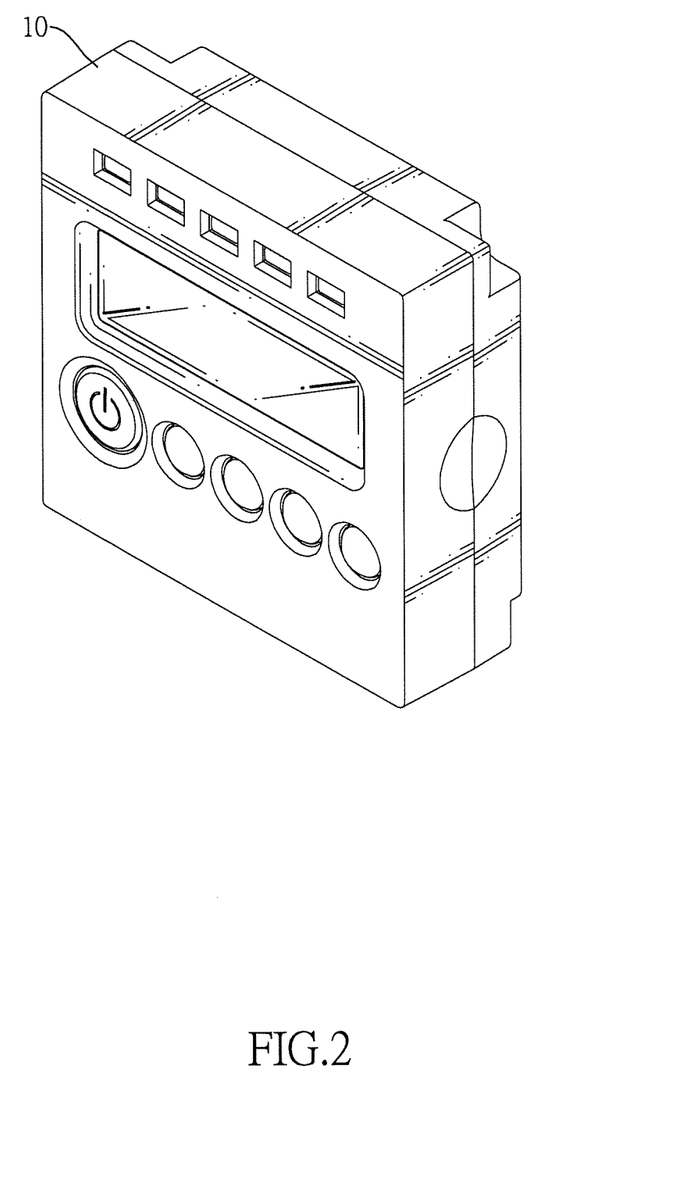
FIG. 2 is another perspective view of the control panel in FIG. 1.
Figure 3:
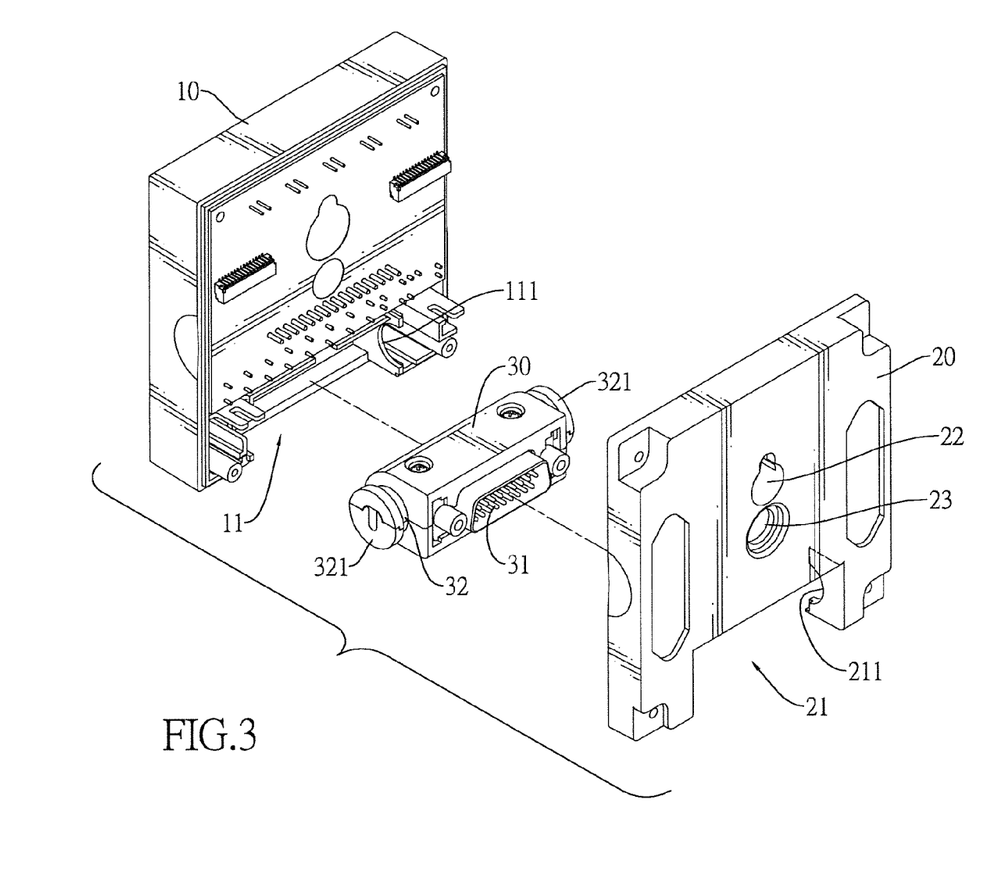
FIG. 3 is an exploded perspective view of the control panel in FIG. 1.

With reference to FIGS. 1 to 3, a control panel in accordance with the present invention has a body 10, a rear cover 20 and a connector 30.

The body 10 has a recess 11 and two first holders 111. The recess 11 is formed in a lower portion on a rear of the body 10. The first holders 111 are parallelly and respectively formed on and protrude rearwards from two opposite inner walls of the recess 11. In the present embodiment, each first holder 111 has a semicircular indentation formed in and recessed from a free end of the first holder 111.

The rear cover 20 is mounted on the rear of the body 10, and has an opening 21, two second holders 211, a wallmount hole 22 and a connection hole 23. The opening 21 is formed through a bottom portion of the rear cover 20, and corresponds to and communicates with the recess 11 of the body 10. The second holders 211 are parallelly and respectively formed on and protrude forwards from two opposite inner walls of the opening 21 and respectively align with the first holders 111. In the present embodiment, each second holder 211 has a semicircular indentation formed in and recessed from a free end of the second holder 211. When each second holder 211 is combined with a corresponding first holder 111, a circular hole is formed by the semicircular indentations of the first holder 111 and the second holder 211. The wallmount hole 22 and the connection hole 23 are formed through the rear cover 20.

The connector 30 is pivotally mounted in the recess 11 of the body 10 and the opening 21 of the rear cover 20. The connector 30 has a plug 31, two pivot joints 32 and two discs 321. The plug 31 is mounted on the connector 30 and serves to be connected with a machine. The two pivot joints 32 are respectively formed on two opposite sides of the connector 30. Each pivot joint 32 is held in the circular hole formed by the semicircular indentations of a corresponding first holder 111 and a corresponding second holder 211. The discs 321 are respectively formed on and coaxial with the pivot joints 32. The discs 321 are larger in diameter than the pivot joints 32 and the circular holes formed by the first holders 111 and the second holders 211 so that each pivot joint 32 is rotatable within a corresponding first holder 111 and a corresponding second holder 211 without axially coming off from the circular hole formed by the first holder 111 and the second holder 211.

Depending on the operation condition of the control panel, the connector 30 can be pivoted to align with a proper orientation based on the operation condition.

Figure 4:
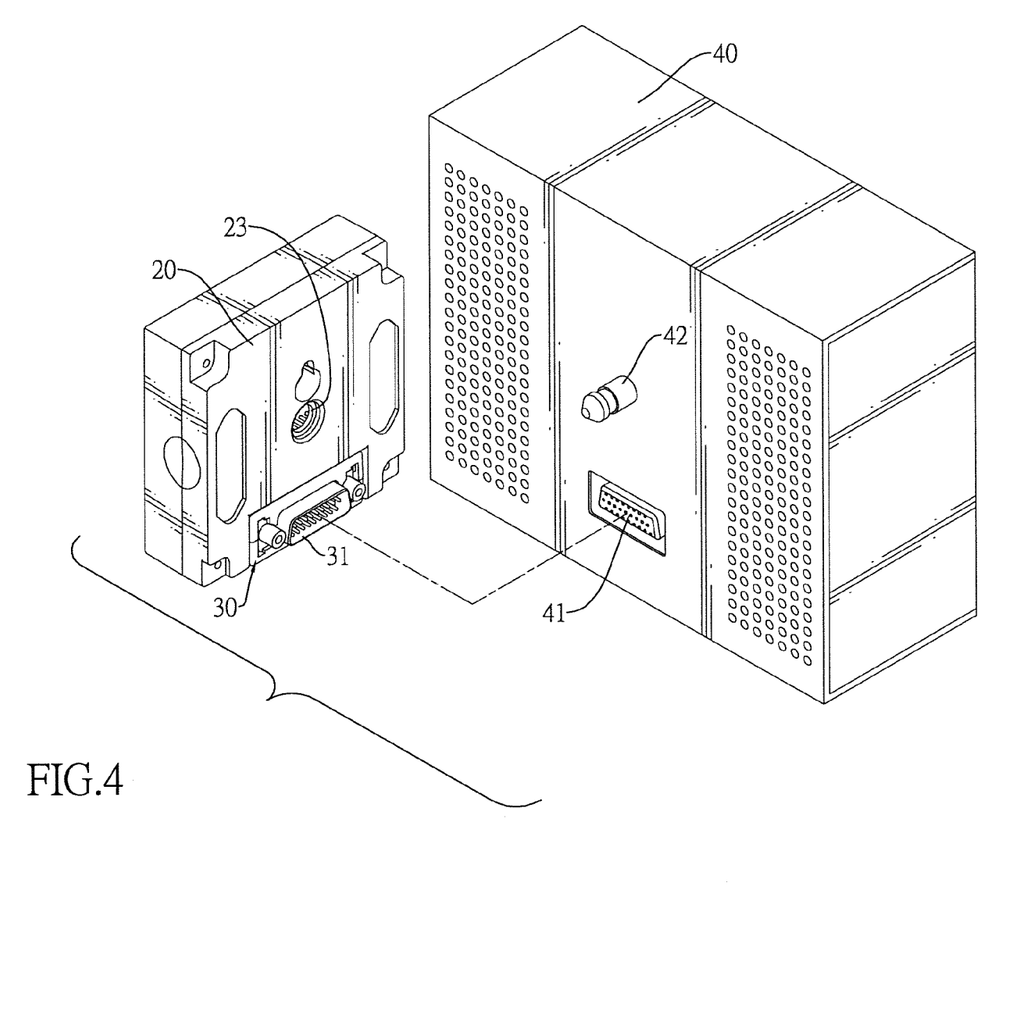
FIG. 4 is an exploded perspective view of the control panel in FIG. 1 mounted to a machine.
Figure 4A:
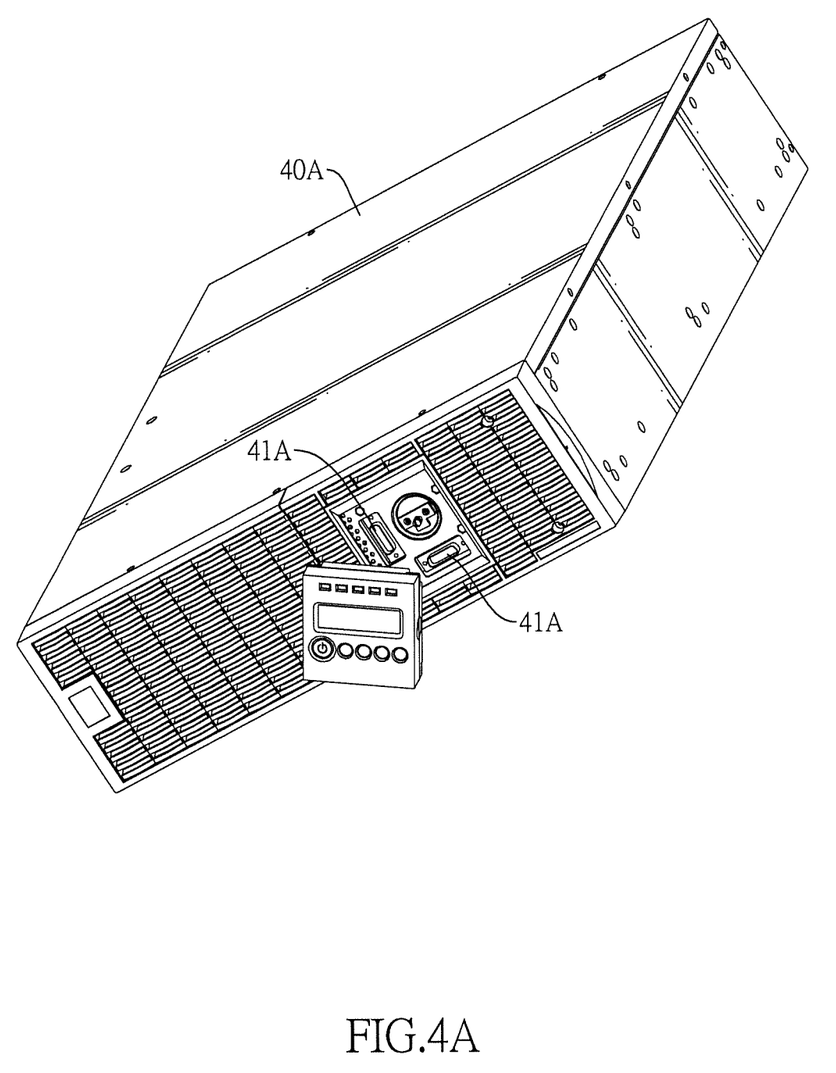
FIG. 4A is a first perspective view of the control panel in FIG. 1 mounted to another machine.
Figure 4B:
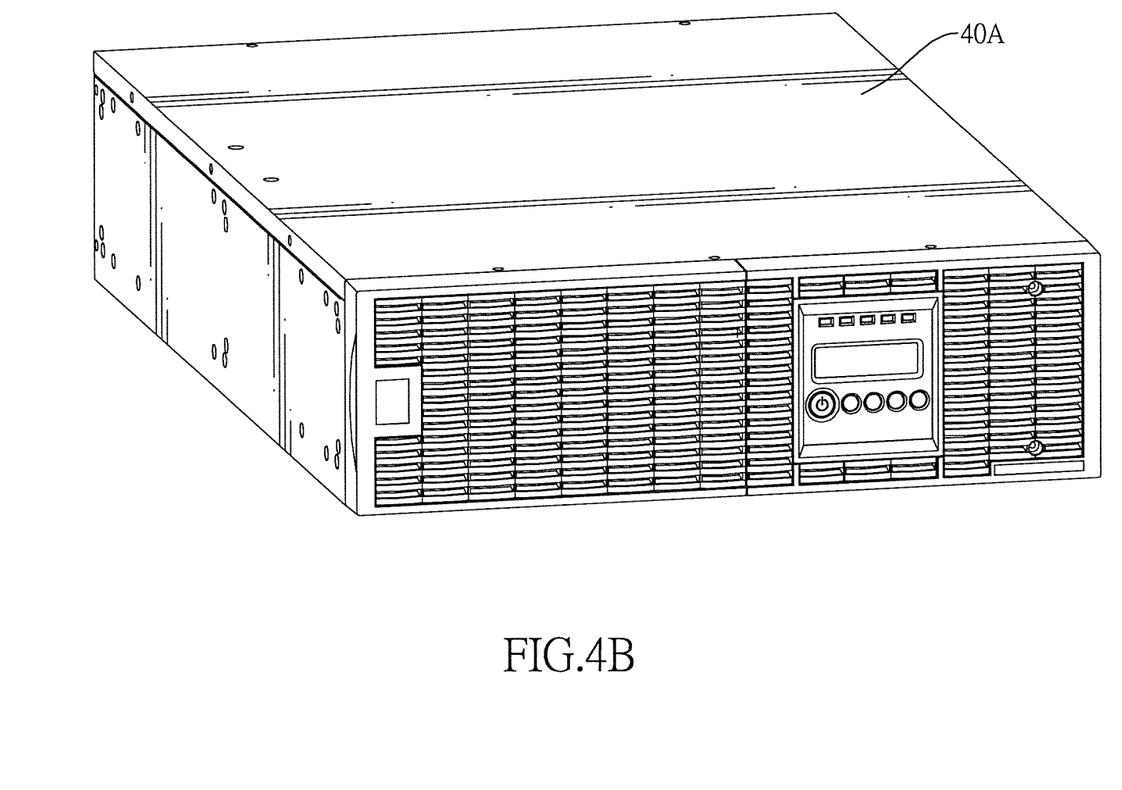
FIG. 4B is a second perspective view of the control panel in FIG. 1 mounted to another machine.
Figure 4C:
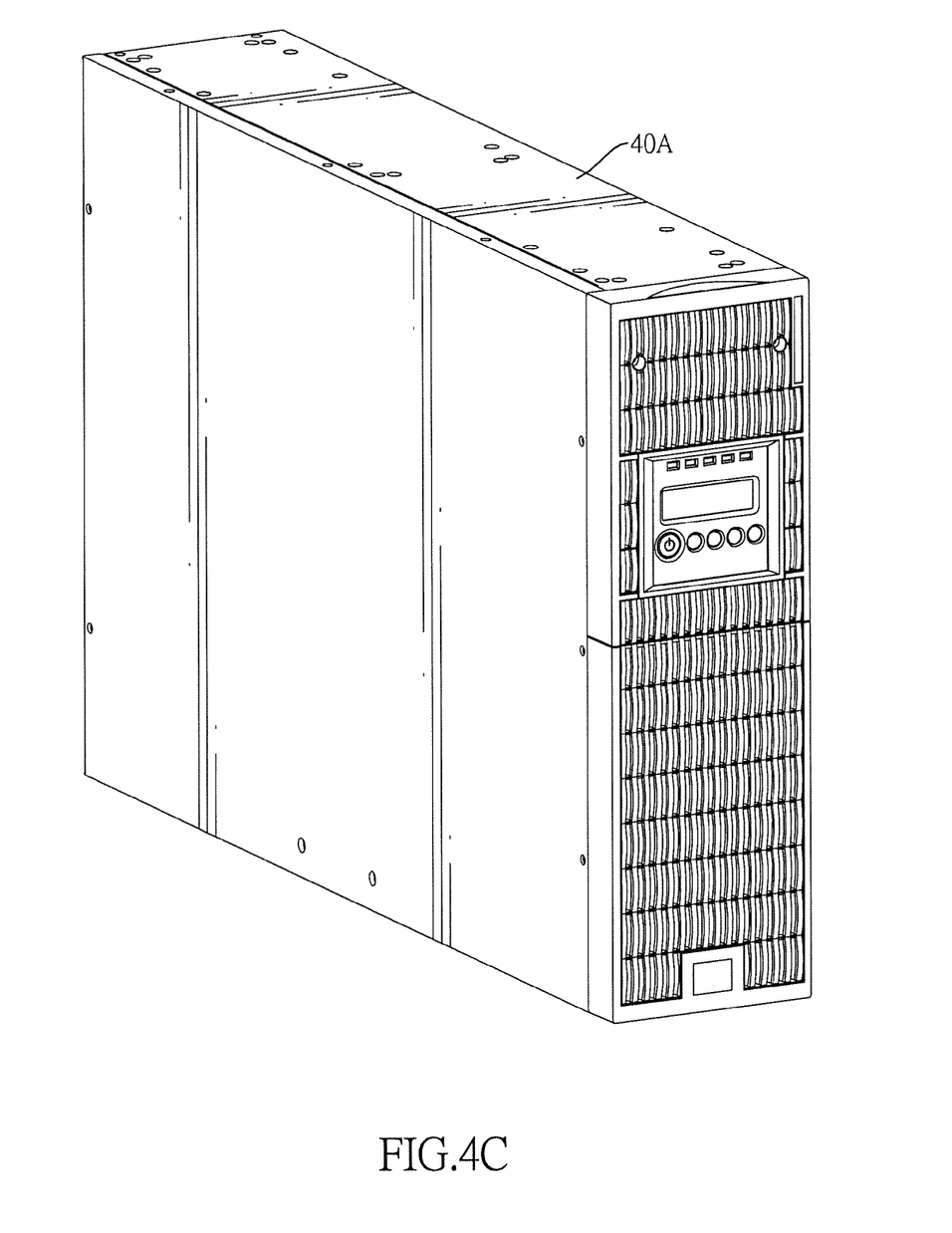
FIG. 4C is a third perspective view of the control panel in FIG. 1 mounted to another machine.

With reference to FIG. 4, when the control panel is directly mounted on a side of a machine 40, a connection pin 42 of the machine 40 is mounted through the connection hole 23 of the control panel, and the connector 30 is pivoted to make the plug 31 face rearwards. Thus, the plug 31 of the control panel can be smoothly connected with a connection port 41 of the machine 40, and the control panel can communicate with the machine 40. With reference to FIGS. 4A to 4C, when the control panel is applied to a machine 40A, the control panel has a connection port 41A of different orientation. The connector 30 can be pivoted and connected with the connection port 41A of the machine 40A based on the orientation of the connection port 41A.

Figure 5:
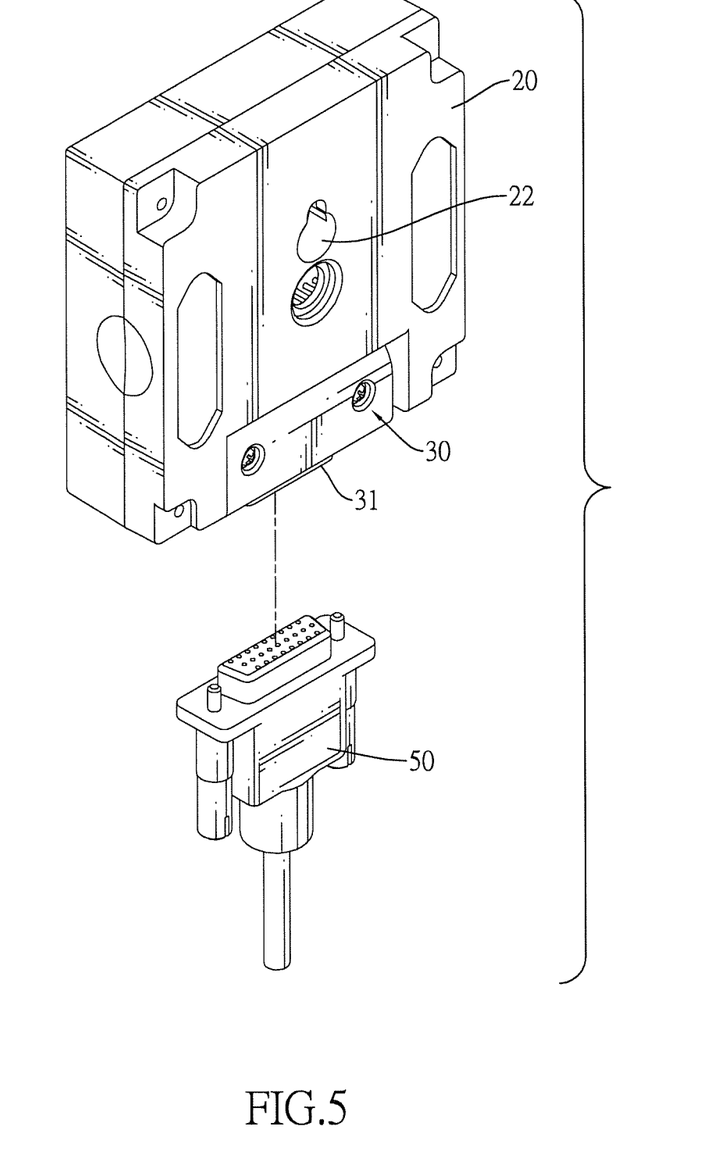
FIG. 5 is an exploded operational perspective view of the control panel in FIG. 1 aligning in a wallmount orientation.
Figure 6:
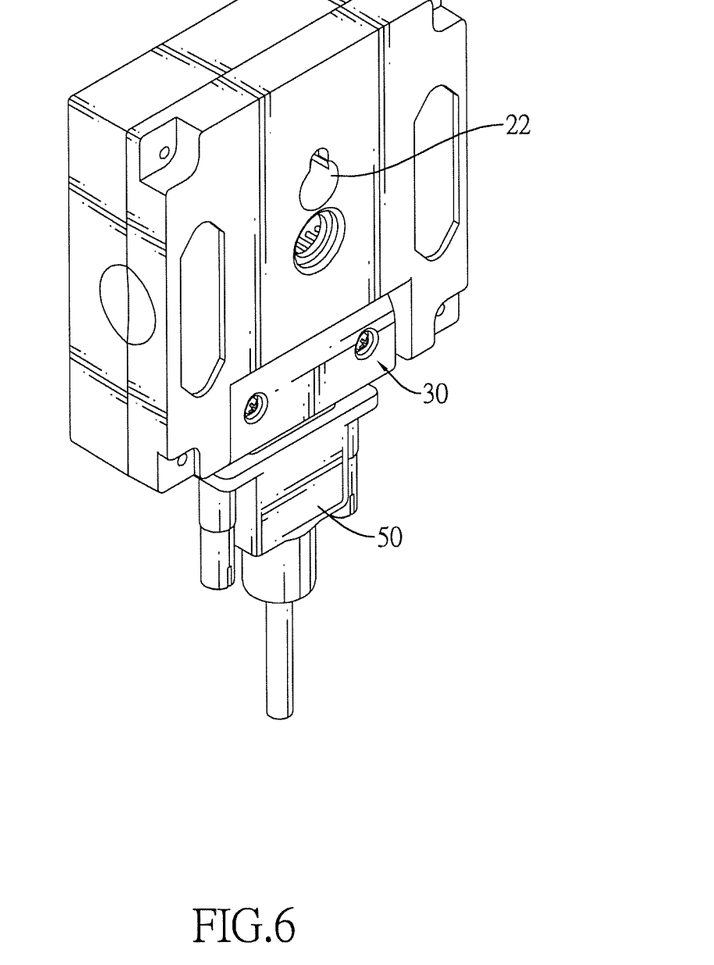
FIG. 6 is a perspective view of the control panel in FIG. 5.
Figure 9:
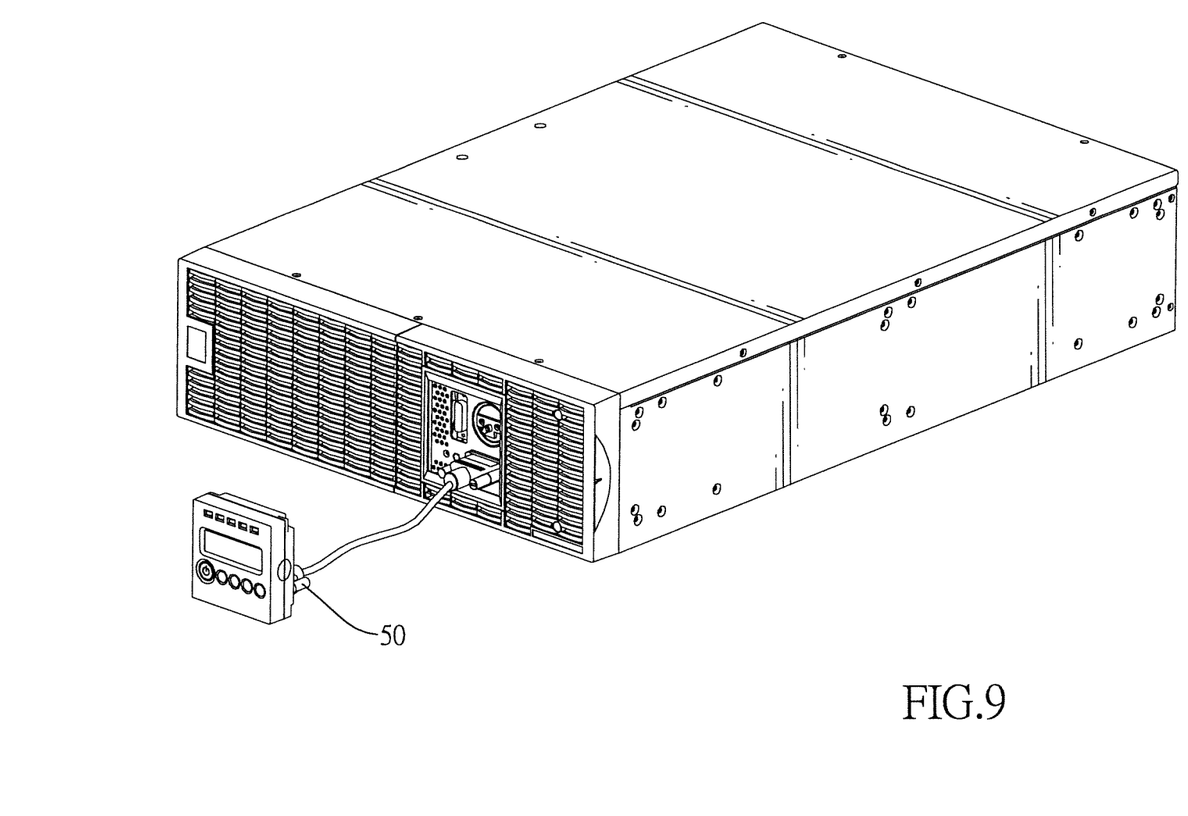
FIG. 9 is an operational perspective view of the control panel in FIG. 1 connected with a machine with a connection cable.
Figure 10:
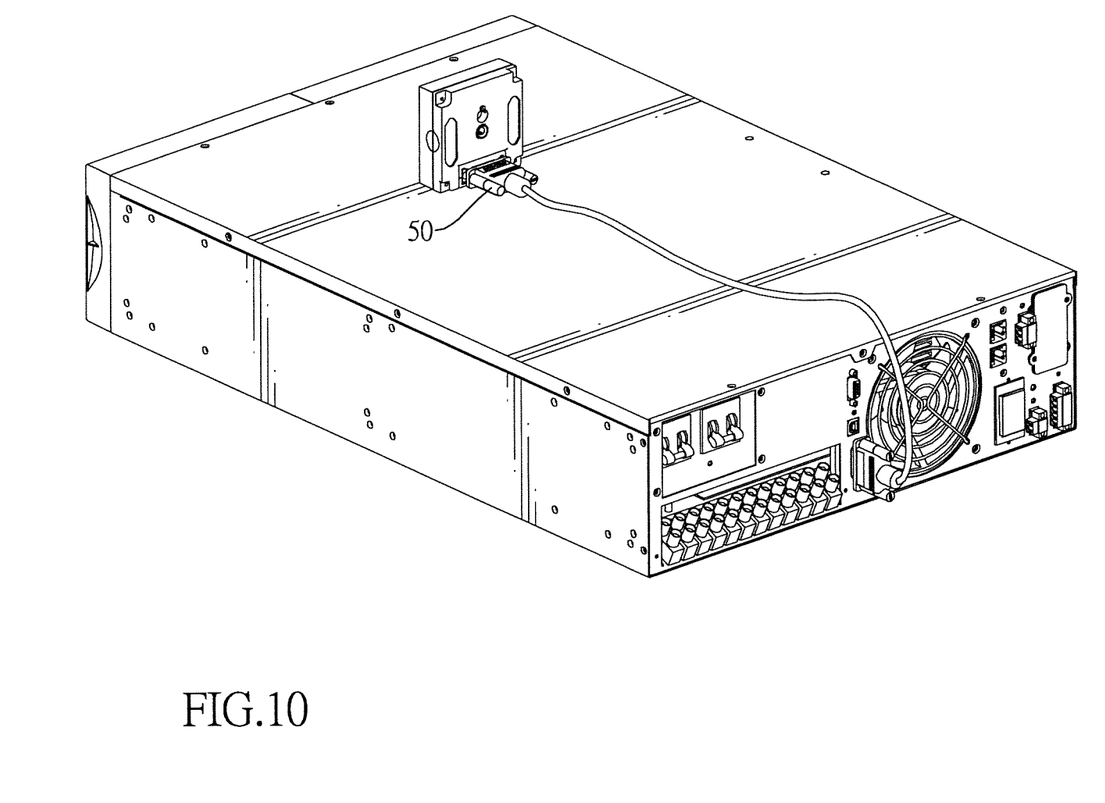
FIG. 10 is another operational perspective view of the control panel in FIG. 1 connected with a machine with a connection cable.

With reference to FIGS. 5 and 6, when the control panel is mounted on a wall, a hook on the wall can be mounted through the wallmount hole 22 of the rear cover 20 of the control panel, and the connector 30 of the control panel is pivoted to make the plug 31 face down. Thus, the control panel can be attached on the wall with the plug 31 of the control panel smoothly connected with the connection cable 50 of a machine. With reference to FIGS. 9 and 10, after being connected with the connection cable 50, the control panel can be flexibly positioned in diversified ways.

Figure 7:
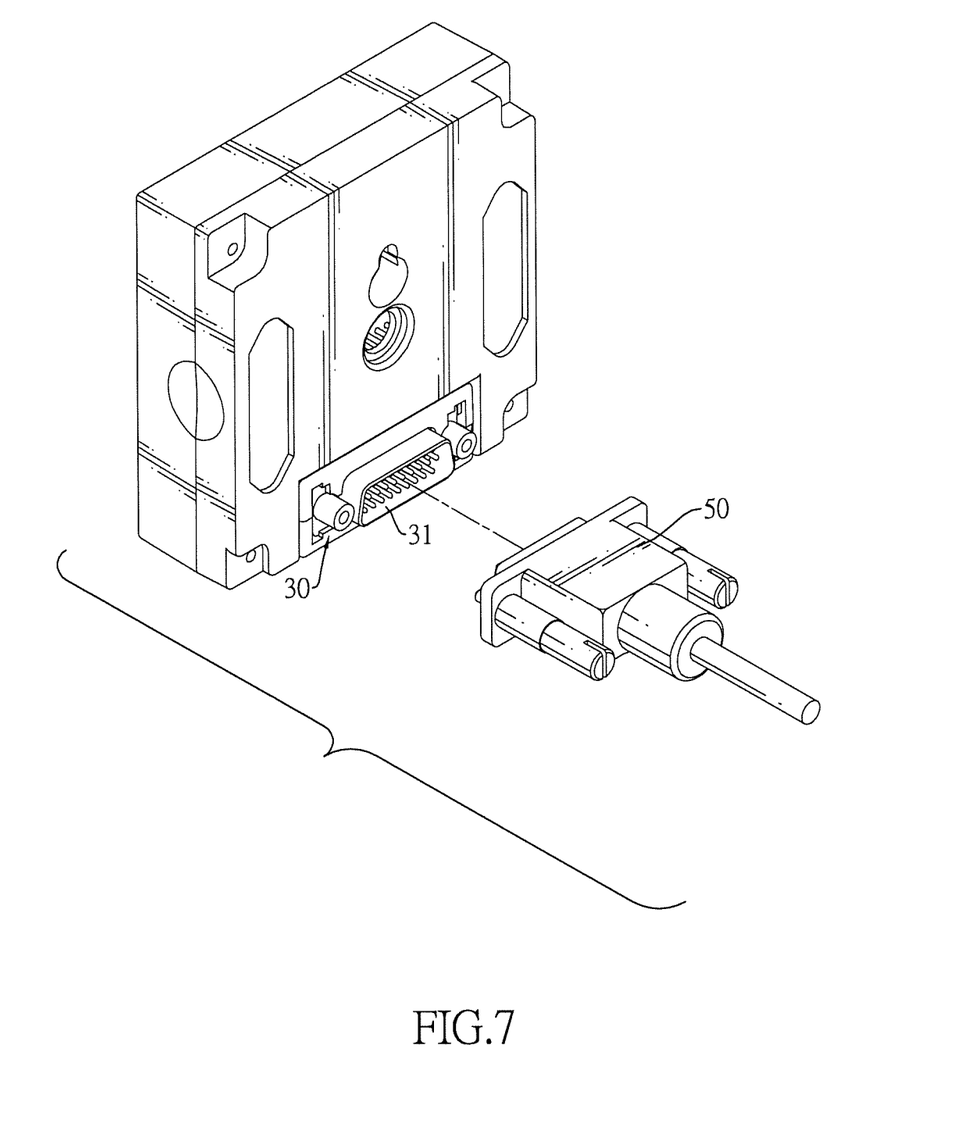
FIG. 7 is an exploded operational perspective view of the control panel in FIG. 1 aligning in a tablemount orientation.
Figure 8:
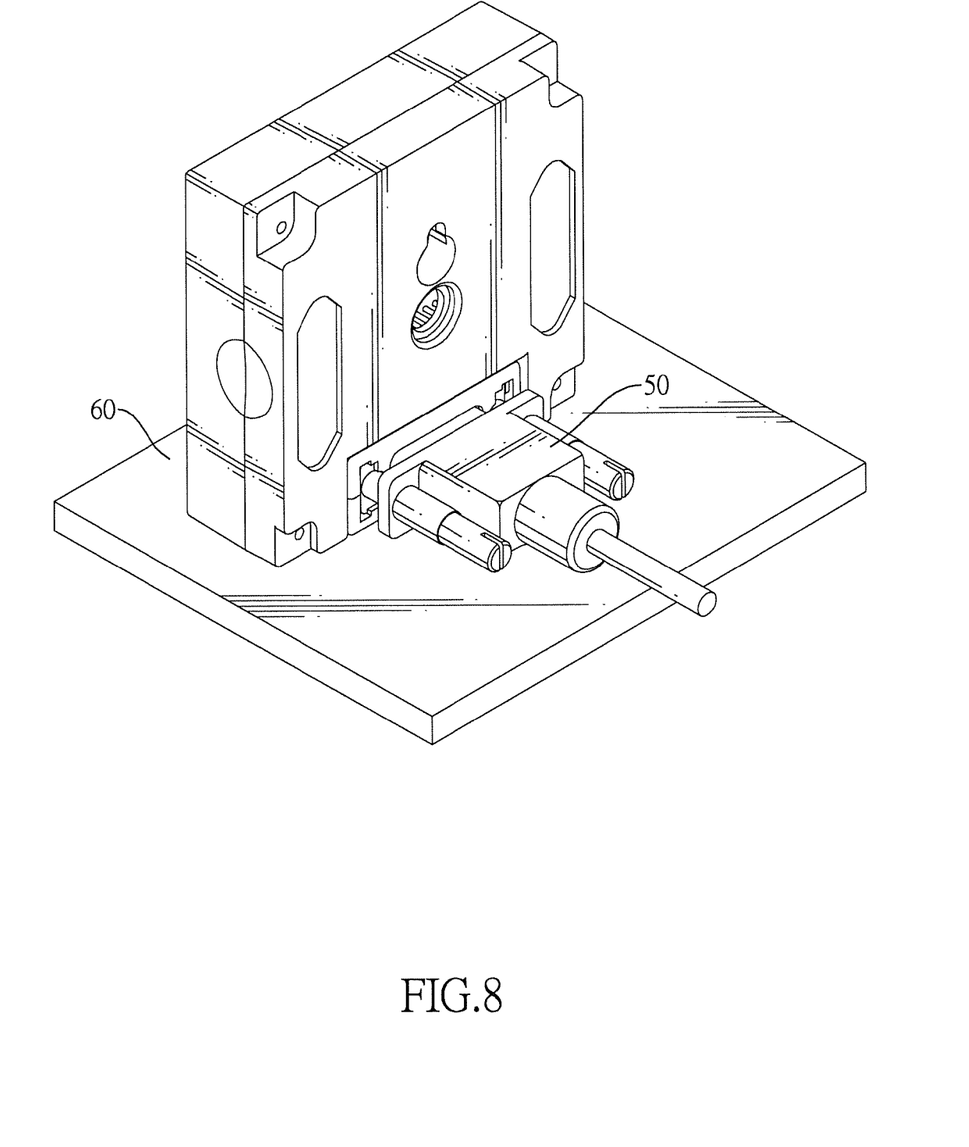
FIG. 8 is an operational perspective view of the control panel in FIG. 7.

With reference to FIGS. 7 and 8, when the control panel is placed on a table 60, the connector of the control panel is pivoted to make the plug 31 of the control panel face rearwards. Thus, the plug 31 is connected to a machine through a connection cable 50 of the machine. As the connection cable 50 smoothly extends from the rear of the control panel, the control panel will not unstably tilt and can be firmly placed on the table.

Accordingly, whether the control panel is mounted on a machine, a wall or a table, the control panel can be steadily attached on the mounting surface and facilitates itself to be conveniently connected with a connection port of a machine directly or through an external connection cable.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A control panel having a pivotable connector, comprising:
 a body having:
  a rear;
  a recess formed in a lower portion of the rear and having two opposite inner walls; and
  two first holders being parallelly and respectively formed on and protruding rearwards from the two opposite inner walls of the recess, each first holder having a semicircular indentation formed on and recessed from a free end of the first holder;
 a rear cover mounted on the rear of the body, and having:
  an opening formed through a bottom portion of the rear cover, corresponding to and communicating with the recess of the body, and having two opposite inner walls;
  two second holders being parallel and respectively formed on and protruding forwards from the two opposite inner walls of the opening and respectively aligning with the first holders, each second holder having a semicircular indentation formed on and recessed from a free end of the second holder; and
  a wallmount hole and a connection hole formed through the rear cover; and
 a connector pivotally mounted in the recess of the body and the opening of the rear cover, and having:
  a plug mounted on the connector;
  two pivot joints respectively formed on two opposite sides of the connector, each pivot joint held within a corresponding first holder and a corresponding second holder; and
  two discs respectively formed on and being coaxial with the pivot joints, and being larger in diameter than circular holes formed by the semicircular indentations of the first holders and the second holders.

* * * * *